Jan. 12, 1954 R. O. ENDRES 2,666,139

SEMICONDUCTOR RELAXATION OSCILLATOR

Filed Sept. 30, 1949 2 Sheets-Sheet 1

Inventor
Richard O. Endres

By H. L. Newton
Attorney

Jan. 12, 1954 R. O. ENDRES 2,666,139

SEMICONDUCTOR RELAXATION OSCILLATOR

Filed Sept. 30, 1949 2 Sheets-Sheet 2

Inventor
Richard O. Endres
By H. W. Newton
Attorney

Patented Jan. 12, 1954

2,666,139

UNITED STATES PATENT OFFICE 2,666,139

SEMICONDUCTOR RELAXATION OSCILLATOR

Richard O. Endres, Audubon, N. J., assignor to Radio Corporation of America, a corporation of Delaware Application September 30, 1949, Serial No. 118,905

16 Claims. (Cl. 250—36)

This invention relates generally to relaxation oscillators, and more particularly relates to pulse or saw-tooth wave generators of the type employing a semi-conductor device.

The three-electrode semi-conductor has recently been developed as an amplifier or oscillator. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948 issue. The new amplifier includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conducting material. This amplifier provides voltage as well as current gain under proper operating conditions and may be considered as a three-terminal network having a common input and output terminal. Thus, the device is effectively a four-terminal network having a common input and output electrode which may, for example, be the base electrode.

In a copending application of E. Eberhard, filed January 4, 1949, Serial No. 70,661, entitled "Relaxation Oscillators," there has been disclosed and claimed a relaxation oscillator which may be utilized for developing a saw-tooth wave or square-topped pulses. The relaxation oscillator is of the type having a capacitor which is slowly charged by a battery through a resistor and is suddenly discharged. The semi-conductor device is utilized for discharging the capacitor. The voltage across the capacitor determines the point of discharge which is reached when the semi-conductor device approaches its regenerative region. At this point a current gain is obtained so that the capacitor can be discharged very rapidly. This relaxation oscillator may be synchronized by externally applied pulses. Alternatively, the oscillator may be arranged to be quiescent in which case it may be triggered by pulses. Finally, the oscillator may be utilized as a frequency divider. However, it has been found that this type of oscillator is not as stable as desired for some applications. Thus, the oscillator is quite sensitive to variations of its supply voltage and it is therefore not well adapted, for example, for use in an impulse counter.

It is the principal object of the present invention to provide improved relaxation oscillators of the type employing a semi-conductor device.

A further object of the present invention is to provide novel pulse or saw-tooth wave generators including a semi-conductor device which may be arranged as an ocillator, in which case the oscillator may be synchronized by externally applied pulses or may be used as a frequency divider; finally, the generator may be arranged to be normally quiescent and may be triggered by pulses.

Another object of the invention is to provide novel semi-conductor relaxation oscillators which are more stable in operation and which can tolerate greater variations of the operating voltages than previously known relaxation oscillators of the semi-conductor type.

A relaxation oscillator in accordance with the present invention includes a semi-conductor device having a semi-conducting body provided with a base electrode, an emitter electrode and a collector electrode in contact with the body. An inductor is connected between the base electrode and ground and operates without parallel resonance to control the frequency of the oscillator. Furthermore, a resistor is provided between a source of voltage and the collector electrode. The emitter electrode is biased in a conventional manner either by a battery or by self-bias means, as is well known. An oscillator of this type will oscillate at a frequency determined by the inductance of the inductor as a current controlling device and by the resistive load which the semi-conductor device presents and which determines the decay time of the voltage developed across the inductor.

An oscillator of this type may be synchronized. Alternatively, it may be arranged to be normally quiescent. This may be effected by adjusting the supply voltages applied to the electrodes of the device. In that case, the circuit may be triggered by externally applied pulses.

Various modifications of this basic oscillator circuit will be disclosed hereinafter. Some of them combine the features of the Eberhard oscillator above referred to with the novel relaxation oscillator of the present invention having an inductor in its base lead. Such an oscillator will be considerably more stable than previously known relaxation oscillators of the semi-conductor type because two circuits drive the oscillator simultaneously into the regenerative region. Alternatively, it is feasible to provide a parallel resonant circuit which may be coupled or connected to the base electrode. This arrangement in combination with the Eberhard relaxation oscillator will yield a novel type of relaxation oscillator which may be used as a frequency divider.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
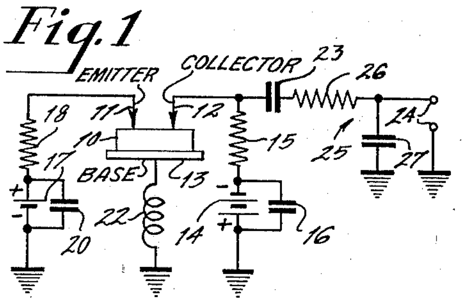
Figure 1 is a circuit diagram of a self-oscillating, semi-conductor relaxation oscillator including an inductor as the frequency determining element and embodying the present invention.

Referring now to the drawings, in which like components have been designated by the same reference numerals throughout the figures, and particularly to Figure 1, there is illustrated a relaxation oscillator in accordance with the invention, comprising a semi-conductor device. The semi-conductor device includes body 10 of semi-conducting material which may consist, for example, of boron, silicon, germanium, tellurium or selenium containing a small but sufficient number of atomic impurity centers or lattice imperfections as commonly employed for best results in crystal rectifiers. Germanium is the preferred material for body 10 and may be prepared so as to be an electronic N-type semiconductor, as is well known. The surface of semi-conducting body 10 may be polished and etched in a conventional manner. It is also feasible to utilize the germanium block from a commercial high-back-voltage germanium rectifier, such as the type 1N34, in which case further surface treatment may not be required.

Semi-conducting body 10 is provided with emitter electrode 11, collector electrode 12 and base electrode 13. Emitter electrode 11 and collector electrode 12 are usually small-area electrodes and may be point contacts consisting, for example, of tungsten or Phosphor bronze wires having a diameter of the order of 2 to 5 mils and a pointed tip. However, it is not essential that emitter electrode 11 and collector electrode 12 are small-area electrodes provided they make rectifying, high-resistance contacts with body 10. Emitter and collector electrodes 11 and 12 are ordinarily placed closely adjacent to each other on the same surface of body 10 or on opposite surfaces thereof in which case they may be separated by a distance of from 2 to 5 mils. Base electrode 13 provides a low-resistance, non-rectifying contact with the bulk material of semiconducting body 10 and usually is a large-area electrode.

A comparatively large reverse bias voltage is normally applied between collector electrode 12 and base electrode 13. Assuming an N-type semiconducting body 10, which is believed to have a P-type surface layer, a negative voltage must be applied to collector electrode 12 with respect to base electrode 13. To this end, there may be provided battery 14 having its positive terminal grounded while its negative terminal is connected to collector electrode 12 by resistor 15. Battery 14 may be by-passed for alternating-frequency currents by bypass capacitor 16. Furthermore, a comparatively small forward bias voltage is normally impressed between emitter electrode 12 and base electrode 13. Assuming, again, an N-type semi-conducting body 10, which is presumed to have a P-type surface layer, a positive voltage must be applied to emitter electrode 11 with respect to base electrode 13. To this end, battery 17 may be provided having its negative terminal grounded while its positive terminal is connected to emitter electrode 11 through resistor 18. Battery 17 may be by-passed for alternating-frequency currents by capacitor 20. Resistor 18 is not required for the operation of the oscillator of Figure 1 but serves to limit the emitter current.

In accordance with the present invention, inductor 22 is connected between base electrode 13 and ground. The device as described will operate as a relaxation oscillator. An output wave which consists of positive pulses may be derived across collector resistor 15. To this end, coupling capacitor 23 which also serves as a blocking capacitor, is connected to the collector electrode 12 and the output may be derived from the output terminals 24, one of which is connected to capacitor 23 while the other one is grounded. To obtain sharper output pulses a differentiating network 25 may be provided including series resistor 26 and shunt capacitor 27.

Figure 2:
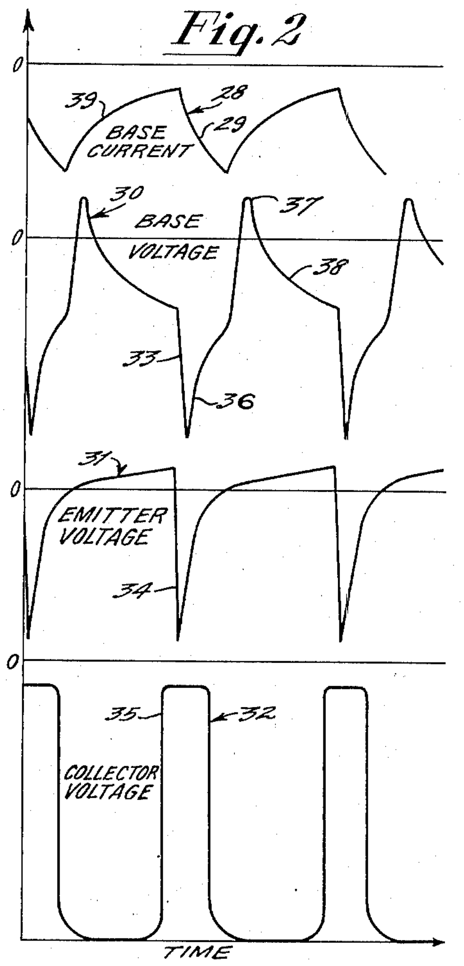
Figure 2 is a graph showing the voltages at the three electrodes of the oscillator of Figure 1.

The operation of the oscillator of Figure 1 will be better understood by reference to Figure 2 wherein curve 30 indicates the base voltage with respect to time, curve 31 the emitter voltage and curve 32 the collector voltage, is indicated in Figure 2. Curve 28 shows the base current plotted so that a decrease of the curve indicates an increase of the net current flowing from ground through inductor 22 to base electrode 13. The oscillator of Figure 1 is biased to a regenerative condition. To this end, the supply voltages applied by batteries 14 and 17 should be properly adjusted and furthermore a high impedance at the oscillatory frequency should be provided between base electrode 13 and a fixed potential point such as ground.

Let it now be assumed that the oscillator has reached the point in its cycle of oscillation where the regenerative condition prevails. Accordingly, a comparatively heavy current will flow from ground through inductor 22, base electrode 13, collector electrode 12, resistor 15 and battery 14 back to ground as indicated by curve portion 29. Consequently, the voltage of base electrode 13 will increase in a negative direction, as shown by curve portion 33 of curve 30. At the same time, the emitter voltage will increase in a negative direction due to the heavier emitter current, as shown by curve portion 34 of emitter voltage curve 31, while the collector voltage increases in a positive direction, as shown by curve portion 35 of collector voltage curve 32.

The voltage across an inductance such as inductor 22 is proportional to the negative value of the rate of change of the current through the inductance, or, in other words, to the negative value of the first derivative of the current with respect to time. Accordingly, as the rate of change of the base current as indicated by curve portion 29 decreases, the base voltage increases again in a positive direction as indicated by curve portion 36. Eventually, the voltages at the electrodes of the oscillator will change in such a direction that the base current decreases again as indicated by curve portion 29. This abrupt change of the rate of change of the current causes a positive voltage swing across inductor 22 which reaches a positive peak indicated at 37. Due to the decrease of the emitter and collector currents, the emitter voltage approaches the positive voltage of battery 17 during this time while the collector voltage approaches the negative voltage of battery 14 as clearly shown in Figure 2.

Finally, the high positive base voltage decays again exponentially at a rate determined by the inductance of inductor 22 and by the resistive load represented by the semi-conductor device. This resistive load is simply the resistance looking into base electrode 13. The exponential decay of the base voltage is illustrated by curve portion 38 of base voltage curve 30. It will thus be seen that the operation of the oscillator of Figure 1 is controlled essentially by the current flowing through base inductor 22.

Eventually, the emitter and base voltages reach such a value that the region of regeneration is again approached and the next cycle of oscillation starts again in the manner previously described. It will accordingly be seen that the frequency of oscillation is determined solely by the inductance of inductor 22 and by the resistive load presented by the semi-conductor device. Experiments have revealed that this frequency of oscillation is considerably lower than that which would exist if the oscillator would operate as a sine wave oscillator having a parallel resonant circuit connected to its base electrode. This parallel resonant circuit includes the inductance of inductor 22 and the distributed capacitance between base electrode 13 and ground as well as the distributed capacitance of inductor 22.

While it will be understood that the circuit specifications of the relaxation oscillator of Figure 1 may vary according to the design for any particular application, the following circuit specifications are included, by way of example only, as suitable for an output pulse frequency of 100 kc. (kilocycles):

| | | |
|---|---|---|
| Resistor 15 | ohms | 1000 |
| Resistor 18 | do | 100 |
| Inductor 22 | millihenries | 4.5 |

As pointed out hereinabove, positive pulses, such as shown at 32 in Figure 2, may be derived from output terminals 24. These pulses may be differentiated by network 25 to obtain still sharper output pulses. If desired, the negative portion of the differentiated output pulse may be removed by a clipper, which may consist of a crystal rectifier. The frequency of oscillation of the oscillator of Figure 1 would be of the order of 1,000 kc. if it were assumed that the distributed capacitance of inductor 24 amounts to a few micro-microfarads, and if it were assumed that the oscillator would operate as a two-terminal sine wave oscillator of the type disclosed and claimed in a copending application of E. Eberhard, filed January 28, 1949, Serial No. 73,352, and entitled "Sine Wave Oscillators."

Figure 3:
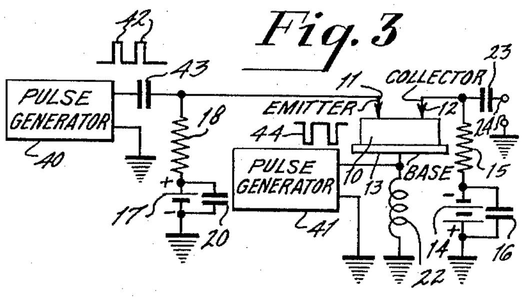
Figure 3 is a circuit diagram of a relaxation oscillator similar to that of Figure 1 which may either be triggered or synchronized by externally applied pulses in accordance with the invention.

The relaxation oscillator of Figure 3 is substantially identical with that of Fig. 1. However, pulse generators 40 and 41 have been illustrated for developing pulses which may be applied to emitter electrode 11 or to base electrode 13. Thus, pulse generator 40 may develop positive pulses as indicated at 42 which may be applied to emitter electrode 11 through coupling capacitor 43. Alternatively, negative pulses as shown at 44 which are developed by pulse generator 41, may be applied across inductor 22.

Pulses 42 or 44 may be synchronizing pulses which may be utilized for triggering the oscillator slightly ahead of the time when it would normally reach the regenerative region. Thus, it will be obvious that a negative pulse applied to base electrode 13 during the time the voltage across inductor 22 decays as shown by curve portion 38 of Figure 2 will drive the oscillator into its regenerative region. The same applies if a positive pulse is impressed on its emitter electrode at that time, as will be evident from an inspection of curve 31 of Figure 2.

It is also feasible to arrange the oscillator of Figure 3 in such a manner that it is normally quiescent. This may be accomplished by reducing either the collector voltage or the emitter voltage or both. In that case the circuit will be unable to reach the regenerative region but may be triggered into this region by the application of either positive trigger pulses 42 applied to its emitter electrode or by impressing negative trigger pulses 44 on its base electrode. It is also feasible to apply a sinusoidal wave to either emitter electrode 11 or to base electrode 13 for triggering the oscillator.

Figure 4:
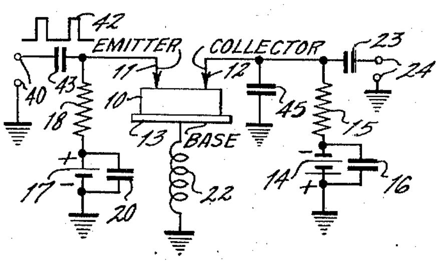
Figure 4 is a circuit diagram of a modified relaxation oscillator in accordance with the invention which further includes an RC network.

The oscillator of Figure 4 combines the features of the oscillator of Figure 1 with that of the Eberhard relaxation oscillator disclosed in the above referred to application Serial No. 70,661. The oscillator of Figure 4 is substantially identical to that of Figure 1 except that capacitor 45 has been provided which is arranged between collector electrode 12 and ground. Accordingly, as previously pointed out, capacitor 45 will be slowly charged to a negative potential from battery 14 through resistor 15. Eventually, when the voltage across capacitor 45 has reached a predetermined negative value the capacitor will be suddenly discharged by the semi-conductor device.

Figure 5:
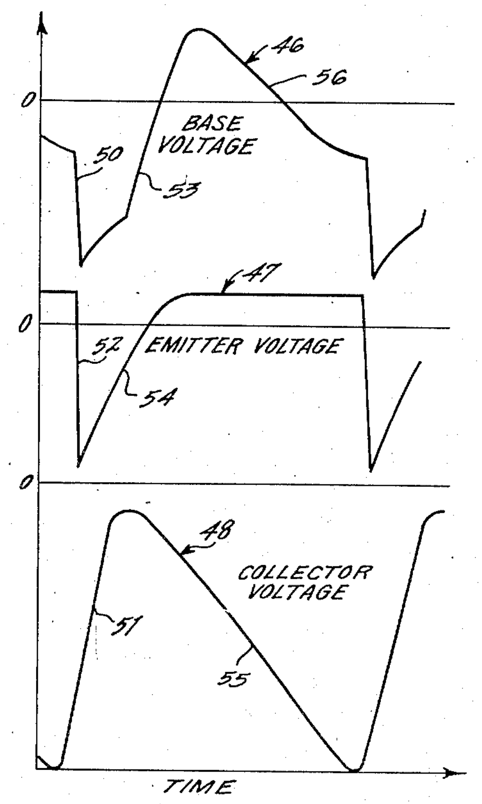
Figure 5 is a graph illustrating the voltages at the three electrodes of the oscillator of Figure 4.

In accordance with the present invention the time constant of the RC network consisting of resistor 15 and capacitor 45 and the inductance of inductor 22 are chosen so that the potentials of the collector and base electrodes will decrease in unison during each cycle of oscillation. This will insure that the relaxation oscillator reaches the regenerative region as determined by its collector potential and by its base potential simultaneously. This is clearly shown in Figure 5 to which reference is now made.

Curve 46 illustrates the base voltage with respect to time, curve 47 the emitter voltage, and curve 48 the collector voltage. Let it be assumed again that the circuit of Figure 4 has reached that point of its cycle of oscillation where it is in a regenerative condition. Accordingly, a large current will flow through inductor 22 and will rapidly discharge capacitor 45. The curve portion 50 of base voltage curve 46 indicates the voltage drop of the base voltage during that period of time. Curve portion 51 of collector voltage curve 48 indicates the rise of the collector voltage toward ground potential which is caused by the discharge of the negative charge on the capacitor 45. The emitter voltage will increase in a negative direction, as indicated by curve portion 52 of curve 47.

Eventually, the flow of current through inductor 22 increases first at a slow rate and then decreases again. This change in the rate of change of the current flowing through inductor 22 will cause the base voltage to rise, as shown by curve portion 53 of curve 46. At the same time, the emitter voltage will rise, as indicated by curve portion 54 of curve 47. The collector voltage, however, will increase in a negative direction, as shown by curve portion 55, because now capacitor 45 is charged to a negative potential from battery 14 through resistor 15. Eventually, the voltage across inductor 22 will again decay, as indicated by curve portion 56. During that period of time, the emitter voltage remains substantially constant since there is substantially no emitter current while the collector voltage continues to increase in a negative direction indicating the continued charging of capacitor 45.

The circuit of Figure 4 is accordingly driven into a regenerative condition simultaneously by inductor 22 connected to base electrode 13 and by the RC network consisting of resistor 15 and capacitor 45 connected to collector electrode 12. During this period of time, both the base voltage and the collector voltage decrease in unison until the point of generation is reached again. The cycle of operation then repeats.

The relaxation oscillator of Figure 4 has greater stability than previously known semi-conductor relaxation oscillators. In other words, this circuit can tolerate a 10 percent change in the voltages applied to emitter electrode 11 and to collector electrode 12 without varying the frequency of oscillation. The base voltage as indicated by curve 46 reaches a higher positive value than the base voltage of the oscillator of Figure 1. A saw-tooth wave may be derived from output terminals 24 coupled to collector electrode 12. It is also feasible to trigger the oscillator of Figure 4 by the application of positive pulses 42 to emitter electrode 11. These positive pulses may be applied to input terminals 40 which schematically represent a pulse generator such as shown in Figure 3. It is also feasible to utilize the oscillator of Figure 4 as a frequency divider. In other words, the frequency of input pulses 42 may be an integral multiple of the free-running frequency of the oscillator.

By way of example, for a free-running frequency of 20 kc. the following circuit constants may be used for the oscillator of Figure 4:

| | | |
|---|---|---|
| Resistor **15** | ohms | 22,000 |
| Resistor **18** | do | 500 |
| Capacitor **45** | microfarads | .0165 |
| Inductor **22** | millihenries | 70 |

The frequency of pulses 42 may be 100 kilocycles. An output pulse of a frequency of 20 kc. may, then be obtained from either emitter electrode 11, collector electrode 12 or from base electrode 13.

Figure 6:
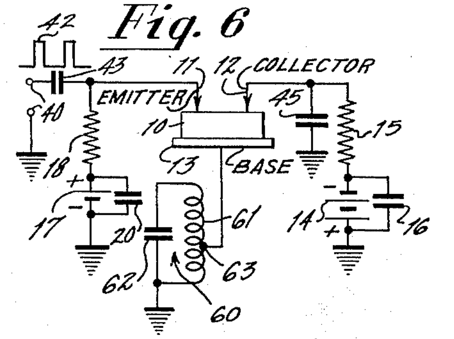
Figure 6 is a circuit diagram of a relaxation oscillator provided in accordance with the invention with a parallel resonant circuit and an RC network, the oscillator being suitable as a frequency divider.

A further overall improvement in stability may be obtained by utilizing the oscillator of the type illustrated in Figure 6. This oscillator is provided with an RC network consisting of resistor 15 and capacitor 45 connected to collector electrode 12. However, in this case a parallel resonant circuit 60 is connected to base electrode 13. The parallel resonant circuit includes inductor 61 and capacitor 62 and has one of its terminals grounded. An intermediate point 63 of inductor 61 is connected to base electrode 13 in order to match the high impedance of the parallel resonant circuit 60 to the comparatively low impedance of the base electrode.

The relaxation oscillator of Figure 6 has the same circuit elements as the quench oscillator disclosed and claimed in a copending application Serial No. 113,262, filed August 31, 1949, entitled "Semi-Conductor Oscillators" by Endres and Eberhard.

In the quench frequency oscillator disclosed by Endres and Eberhard the resonant frequency of the parallel resonant circuit is very much higher than the reciprocal of the time constant of the RC network. In other words, during each charge and discharge cycle of the RC network a large number of oscillations will occur in the parallel resonant circuit. In accordance with the present invention the time constant of resistor 15 and capacitor 45 is only slightly larger than the reciprocal of the resonant frequency of parallel resonant circuit 60. Thus, during each charge cycle of capacitor 45 there will be a few oscillations of parallel resonant circuit 60 such as five or one oscillation. However, the sinusoidal wave developed in parallel resonant circuit 60 will have a substantially constant amplitude.

Figure 7:
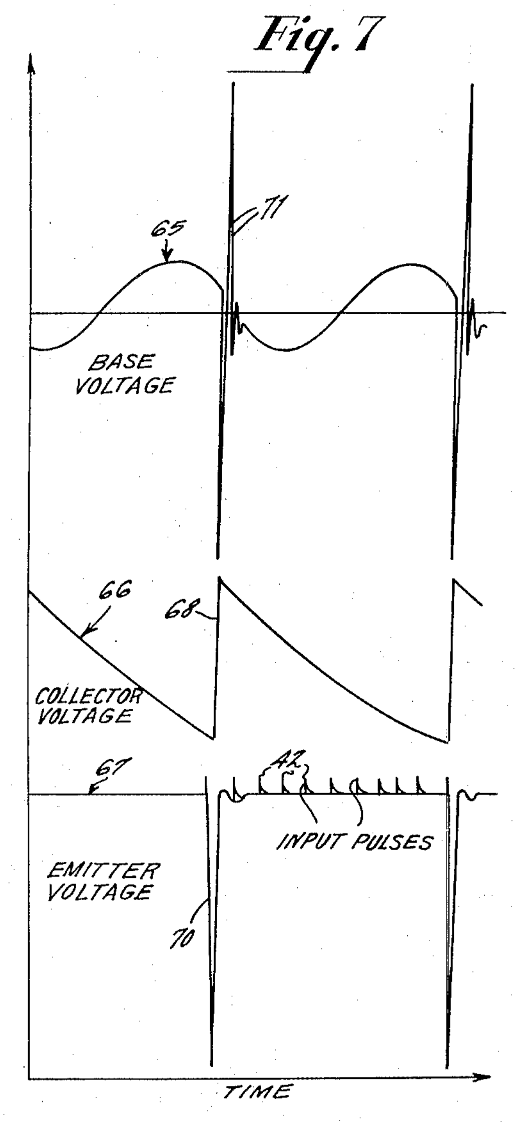
Figure 7 is a graph illustrating the voltages at the three electrodes of the oscillator of Figure 6.

Preferably, however, the time constant of resistor 15 and capacitor 45 is equal to the reciprocal of the resonant frequency of parallel resonant circuit 60. For a better understanding of the operation of the relaxation oscillator of Figure 6, reference is now made to Figure 7 illustrating the base voltage curve 65 plotted with respect to time, the collector voltage shown by curve 66 and the emitter voltage shown by curve 67. The circuit is again biased to regeneration and is so arranged that the base voltage and the collector voltage go in the negative direction at the same time as shown by curves 65 and 66.

Let it now be assumed, again, that the circuit approaches the regenerative region. Accordingly, a large current will flow between the collector and base electrodes in the manner previously described and will rapidly discharge capacitor 45 as shown by curve portion 68 of curve 66. At the same time the emitter voltage will decrease rapidly, as shown by curve portion 70. Simultaneously, the base voltage will first decrease and upon the current being substantially cut off the base voltage will rapidly increase to a very high positive value as shown by curve portion 71. It is to be understood that curve portion 71 has a still higher amplitude compared to the sine wave of curve 65 than shown in Figure 7. During this period of time capacitor 45 is first rapidly discharged, then the current through the base electrode is substantially cut off and capacitor 45 is again slowly charged from battery 14 through resistor 15. During the charging of capacitor 45 the sinusoidal wave developed across parallel resonant circuit 60 continues. When the next downward swing of the sinusoidal wave coincides with a low collector voltage, the regenerative region is reached again whereupon the next cycle begins. If the voltage swing developed across parallel resonant circuit 60 is sufficiently great so that it primarily determines the free-running frequency of the oscillator, a greater change of the collector bias voltage can be tolerated before instability occurs.

It is again feasible to synchronize the oscillator of Figure 6 by the application of positive trigger pulses 42 to its emitter electrode 11. This circuit may also be used as a frequency divider and the frequency of the input pulses 42 may, for example, be ten times the free-running frequency of the oscillator. This has been illustrated in Figure 7 where pulses 42 are shown superimposed on emitter voltage curve 67. By way of example, for a free-running frequency of 10 kc., the following circuit constants may be used for the oscillator of Figure 6:

| | | |
|---|---|---|
| Resistor **15** | ohms | 10,000 |
| Resistor **18** | do | 500 |
| Capacitor **45** | microfarads | .0066 |
| Inductor **61** | millihenries | 23 |
| Capacitor **62** | microfarads | .013 |

The portion of inductor 61 above tap 63 may be four times that below the tap. The frequency of pulses 42 may be 100 kc. The oscillator will be stable over a 60 percent change of the emitter bias voltage and over a 40 percent change of the collector bias voltage. The positive peak voltage of the base may amount to between 20 and 50 volts.

Figure 8:
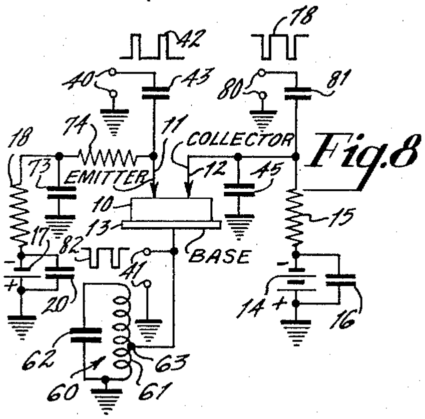
Figure 8 is a circuit diagram of a modification of the oscillator of Figure 6, the oscillator including two RC networks.

The oscillator of the invention may be further stabilized by the provision of a second RC network connected to the emitter electrode. Such an oscillator has been illustrated in Figure 8. The circuit of Figure 8 is substantially identical with that of Figure 6 except that capacitor 73 has been provided between emitter electrode 11 and ground. Furthermore, resistor 74 may be provided in series with resistor 18, and capacitor 73 may be connected to the junction point of the two resistors. The positive terminal of battery 17 is grounded while its negative terminal is connected to resistor 18. The function of resistor 74 is to prevent capacitor 73 from functioning as an alternating current by-pass capacitor. However, resistor 74 is not essential for the operation of the oscillator and may, therefore, be omitted.

Preferably, the time constants of RC network 15, 45 and of the RC network 18, 73 should be equal. However, it is also feasible to make the time constant of network 18, 73 one-half the time constant of RC network 15, 45, that is, half the time between the regenerative pulses of the oscillator of Figure 6. In that case the output frequency will be twice that of the oscillator of Figure 6.

Figure 9:
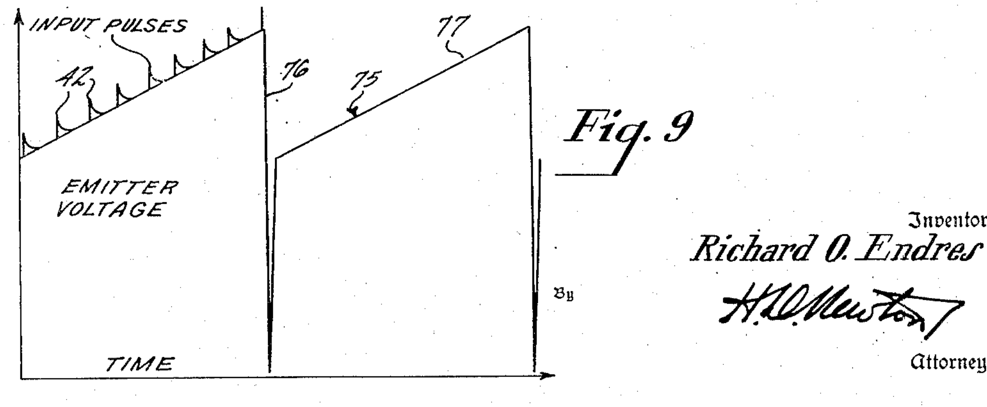
Figure 9 is a graph illustrating the emitter voltage of the oscillator of Figure 8.

The operation of the oscillator of Figure 8 is substantially the same as that of the oscillator of Figure 6. However, the emitter voltage now has the saw-tooth wave shape shown by the curve 75 of Figure 9. Thus, when the regenerative portion of the cycle is reached, the emitter voltage will suddenly decrease, as shown by curve portion 76, and will rapidly increase again. This is due to the suddent discharge of capacitor 73 to a negative potential by the emitter-collector current. Thereupon, capacitor 73 is slowly charged in a positive direction through battery 17 having a small negative potential and resistor 18 as shown by curve portion 77. The input pulses 42 of positive polarity may be impressed through input terminals 40 on emitter electrode 11 as previously explained. It is also feasible to apply negative input pulses 78 on input terminals 80, one of which is coupled to collector electrode 12 through coupling capacitor 81. Similarly, negative pulses shown in 82 may be applied to input terminals 41 connected between base electrode 13 and ground.

It is to be understood that capacitor 45 may be omitted in the circuit of Figure 8 in which case only a single RC network is connected to the emitter electrode. However, such a circuit would not be as stable as that illustrated in Figure 8.

Figure 10:
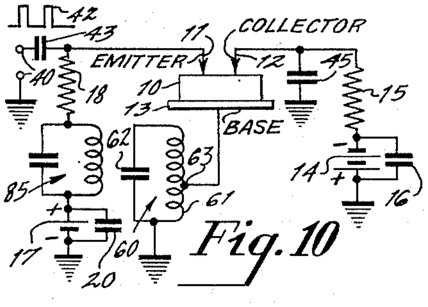
Figure 10 is a circuit diagram of a further modification of the oscillator of Figure 6 embodying the present invention.

Figure 10 illustrates a relaxation oscillator which is a modification of that of Figure 6. In this case, parallel resonant circuit 85 is connected in series with resistor 18 between battery 17 and emitter resistor 18. Parallel resonant circuit 85 also tends to stabilize the frequency of the relaxation oscillator. Preferably, the resonant frequencies of circuits 60 and 85 are equal. The oscillator of Figure 10 otherwise operates in the manner of that of Figure 6 previously described.

There have thus been disclosed various semiconductor relaxation oscillators, some of which have a considerably better stability than previously known relaxation oscillators of the semiconductor type. Some of the oscillators can tolerate appreciable variations of their emitter and collector voltage supplies without changing their frequency of oscillation. The oscillators may be triggered or synchronized. Alternatively, they may be used as frequency dividers in impulse counter circuits.

What is claimed is:

1. A relaxation oscillator including a semi-conductor device having a semi-conducting body, a base electrode, an emitter electrode and a collector electrode in contact with said body, a source of potential, means for applying a forward bias potential between said emitter and base electrodes, a resistor connected between one terminal of said source and said collector electrode, a capacitor connected in shunt with said resistor, and an inductor connected between said base electrode and the other terminal of said source, said source being so poled as to apply a reverse bias potential between said collector and base electrodes.

2. A relaxation oscillator including a semiconductor device having a semi-conducting body, a base electrode, an emitter electrode and a collector electrode in contact with said body, a source of potential, means for applying a forward bias potential between said emitter and base electrodes, a first resistor connected between one terminal of said source and said collector electrode, a capacitor connected in shunt with said first resistor and source, a second resistor connected between said applying means and said emitter electrode, and an inductor connected between said base electrode and the other terminal of said source, said source being so poled as to apply a reverse bias potential between said collector and base electrodes, the time constant of said capacitor and first resistor and the inductance of said inductor being chosen so that the potentials of said collector and base electrodes will decrease in unison during a portion of each cycle of oscillation.

3. A relaxation oscillator including a semiconductor device having a semi-conducting body, a base electrode, an emitter electrode and a collector electrode in contact with said body, a source of potential, means for applying a forward bias potential between said emitter and base electrodes, a resistor connected between one terminal of said source and said collector electrode, a capacitor connected in shunt with said resistor and source, an impedance element connected between said applying means and said emitter electrode, an inductor connected between said base electrode and the other terminal of said source, said source being so poled as to apply a reverse bias potential between said collector and base electrodes, and means for applying pulses to said emitter electrode.

4. A relaxation oscillator comprising a semiconductor device having a semi-conducting body, a base electrode, an emitter electrode and a collector electrode in contact with said body, a source of potential, a resistor connected between a terminal of said source and said collector electrode, a parallel resonant circuit connected to the other terminal of said source, said parallel resonant circuit being coupled to said base electrode, said source being so poled as to apply a reverse bias potential between said collector and base electrodes, a capacitor connected in parallel with said source and said resistor, said capacitor being charged relatively slowly in one direction by said source through said resistor and being discharged relatively rapidly in the other direction through said device, and means for applying a forward bias potential between said emitter and base electrodes, the time constant of said resistor and capacitor being approximately equal to the reciprocal of the resonant frequency of said resonant circuit.

5. A relaxation oscillator comprising a semiconductor device having a semi-conducting body, a base electrode, an emitter electrode and a collector electrode in contact with said body, a source of potential, a first resistor connected between a terminal of said source and said collector electrode, a parallel resonant circuit connected to the other terminal of said source, said parallel resonant circuit being coupled to said base electrode, said source being so poled as to apply a reverse bias potential between said collector and base electrodes, a capacitor connected in parallel with said source and said first resistor, means for applying a forward bias potential between said emitter and base electrodes, and a resistor connected between said means to apply a forward bias and said emitter electrode, the time constant of said first resistor and capacitor being approximately equal to the reciprocal of the resonant frequency of said resonant circuit.

6. A relaxation oscillator comprising a semiconductor device having a semi-conducting body, a base electrode, an emitter electrode and a collector electrode in contact with said body, a source of potential, a first resistor connected between a terminal of said source and said collector electrode, a parallel resonant circuit connected to the other terminal of said source, said parallel resonant circuit being coupled to said base electrode, said source being so poled as to apply a reverse bias potential between said collector and base electrodes, a capacitor connected in parallel with said source and said first resistor, means for applying a forward bias potential between said emitter and base electrodes, said means including a source of potential and a second resistor connected serially between said emitter and base electrodes, the time constant of said first resistor and capacitor being slightly larger than the reciprocal of the resonant frequency of said resonant circuit, and means for applying pulses of positive polarity to said emitter electrode, the frequency of said pulses being an integral multiple of said resonant frequency.

7. A relaxation oscillator comprising a semiconductor device having a semi-conducting body, a base electrode, an emitter electrode and a collector electrode in contact with said body, a first source of potential, a first resistor connected between a terminal of said first source and said collector electrode, a parallel resonant circuit connected to the other terminal of said first source, said parallel resonant circuit being coupled to said base electrode, said first source being so poled as to apply a reverse bias potential between said collector and base electrodes, a second source of potential, a second resistor connected between one terminal of said second source and said emitter electrode, the other terminal of said second source being connected to said parallel resonant circuit, said second source being so poled as to apply a forward bias potential between said emitter and base electrodes, a capacitor connected in parallel with said second source and said second resistor, the time constant of said second resistor and capacitor being of the order of the reciprocal of the resonant frequency of said resonant circuit.

8. A relaxation oscillator comprising a semiconductor device having a semi-conducting body, a base electrode, an emitter electrode and a collector electrode in contact with said body, a first source of potential, a first resistor connected between a terminal of said first source and said collector electrode, a parallel resonant circuit connected to the other terminal of said first source, said parallel resonant circuit being coupled to said base electrode, said first source being so poled as to apply a reverse bias potential between said collector and base electrodes, a first capacitor connected in parallel with said first source and said first resistor, a second source of potential, a second resistor connected between one terminal of said second source and said emitter electrode, the other terminal of said second source being connected to said parallel resonant circuit, said second source being so poled as to apply a forward bias potential between said emitter and base electrodes, a second capacitor connected in parallel with said second source and said second resistor, the time constant of said first resistor and first capacitor being of the order of the reciprocal of the resonant frequency of said resonant circuit.

9. A relaxation oscillator comprising a semiconductor device having a semi-conducting body, a base electrode, an emitter electrode and a collector electrode in contact with said body, a first source of potential, a first resistor connected between a terminal of said first source and said collector electrode, a parallel resonant circuit connected to the other terminal of said first source, said parallel resonant circuit being coupled to said base electrode, said first source being so poled as to apply a reverse bias potential between said collector and base electrodes, a first capacitor connected in parallel with said first source and said first resistor, a second source of potential, a second resistor and a third resistor connected serially between one terminal of said second source and said emitter electrode, the other terminal of said second source being connected to said parallel resonant circuit, said second source being so poled as to apply a forward bias potential between said emitter and base electrodes, a second capacitor connected in parallel with said second source and said second resistor, the time constant of said first resistor and first capacitor being approximately equal to the reciprocal of the resonant frequency of said resonant circuit.

10. An oscillator as defined in claim 8 wherein means are provided for applying trigger pulses to one of said electrodes.

11. An oscillator as defined in claim 10 wherein the frequency of said trigger pulses is an integral multiple of the resonant frequency of said resonant circuit.

12. An oscillator as defined in claim 10 wherein said pulses are of positive polarity and are applied to said emitter electrode.

13. An oscillator as defined in claim 10 wherein said pulses are of negative polarity and are applied to said base electrode.

14. An oscillator as defined in claim 10 wherein wherein said pulses are of negative polarity and are applied to said collector electrode.

15. A relaxation oscillator comprising a semiconductor device having a semi-conducting body, a base electrode, an emitter electrode and a collector electrode in contact with said body, a source of potential, a resistor connected between a terminal of said source and said collector electrode, a parallel resonant circuit connected to the other terminal of said source, said parallel resonant circuit being coupled to said base electrode, said source being so poled as to apply a reverse bias potential between said collector and base electrodes, a capacitor connected in parallel with said source and said resistor, means for applying a forward bias potential between said emitter and base electrodes, a resonant circuit, said resonant circuit and said means being connected serially between said emitter electrode and said parallel resonant circuit for stabilizing the operation of said oscillator, the resonant frequencies of said resonant circuits being substantially equal, and the time constant of said resistor and capacitor being of the order of the reciprocal of said resonant frequencies.

16. An oscillator as defined in claim 15 wherein means are provided for applying pulses of positive polarity to said emitter electrode.

RICHARD O. ENDRES.

References Cited in the file of this patent

UNITED STATES PATENTS

| Number | Name | Date |
|---|---|---|
| 1,949,383 | Weber | Feb. 27, 1934 |
| 2,476,323 | Rack | July 19, 1949 |
| 2,486,021 | Gross | Oct. 25, 1949 |